United States Patent
Ebefors et al.

(10) Patent No.: US 9,511,999 B2
(45) Date of Patent: Dec. 6, 2016

(54) THIN FILM CAPPING

(71) Applicant: SILEX MICROSYSTEMS AB, Järfälla (SE)

(72) Inventors: Thorbjorn Ebefors, Huddinge (SE); Niklas Svedin, Stockholm (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 14/365,235

(22) PCT Filed: Dec. 17, 2012

(86) PCT No.: PCT/SE2012/051402
§ 371 (c)(1),
(2) Date: Jun. 13, 2014

(87) PCT Pub. No.: WO2013/089635
PCT Pub. Date: Jun. 20, 2013

(65) Prior Publication Data
US 2014/0346657 A1    Nov. 27, 2014

(30) Foreign Application Priority Data

Dec. 15, 2011   (SE) .................................. 1151201

(51) Int. Cl.
*H01L 21/76*    (2006.01)
*B81C 1/00*    (2006.01)
*B81B 7/00*    (2006.01)

(52) U.S. Cl.
CPC ......... *B81C 1/00285* (2013.01); *B81B 7/0038* (2013.01); *B81C 1/00293* (2013.01); *B81C 2203/0136* (2013.01); *B81C 2203/0145* (2013.01)

(58) Field of Classification Search
CPC ................. B81C 1/00285; B81C 2203/0136; B81C 2203/0145; B81C 1/00293; B81C 2203/00136; B81C 1/00; B81B 7/0038; B81B 7/00

USPC .................... 438/51, 52, 113, 115, 125, 460; 257/415, 619, 659, 660, 678, 682, 704, 257/E21.002, E29.324
See application file for complete search history.

(56) References Cited

U.S. PATENT DOCUMENTS

| 4,744,863 A | 5/1988 | Guckel et al. |
| 6,416,831 B1 | 7/2002 | Hara et al. |

(Continued)

FOREIGN PATENT DOCUMENTS

| EP | 0849578 | 6/1998 |
| EP | 1433740 | 6/2004 |

(Continued)

OTHER PUBLICATIONS

International Search Report dated May 27, 2013, corresponding to PCT/SE2012/051402.

(Continued)

*Primary Examiner* — Alexander Ghyka
*Assistant Examiner* — Abdulfattah Mustapha
(74) *Attorney, Agent, or Firm* — Young & Thompson

(57) ABSTRACT

A method for sealing cavities in micro-electronic/-mechanical system (MEMS) devices to provide a controlled atmosphere within the sealed cavity includes providing a semiconductor substrate on which a template is provided on a localized area of the substrate. The template defines the interior shape of the cavity. Holes are made so as to enable venting of the cavity to provide a desired atmosphere to enter into the cavity through the hole. Finally, a sealing material is provided in the hole to seal the cavity. The sealing can be made by compression and/or melting of the sealing material.

12 Claims, 22 Drawing Sheets

(56) References Cited

U.S. PATENT DOCUMENTS

| | | |
|---|---|---|
| 7,235,281 B2 | 6/2007 | Rusu et al. |
| 8,062,497 B2 | 11/2011 | Witvrouw et al. |
| 2001/0004085 A1 | 6/2001 | Gueissaz |
| 2004/0224091 A1 | 11/2004 | Rusu et al. |
| 2005/0250253 A1* | 11/2005 | Cheung .................. 438/125 |
| 2007/0235501 A1 | 10/2007 | Heck |
| 2007/0298238 A1 | 12/2007 | Witvrouw et al. |
| 2009/0194309 A1* | 8/2009 | Gillot et al. ............ 174/50 |
| 2009/0215214 A1 | 8/2009 | Renault |
| 2010/0028618 A1* | 2/2010 | Gonska et al. .......... 428/188 |
| 2011/0227173 A1* | 9/2011 | Seppala ............ B81C 1/0023 257/415 |

FOREIGN PATENT DOCUMENTS

| | | |
|---|---|---|
| EP | 1840081 | 10/2007 |
| WO | 2011/073393 | 6/2011 |

OTHER PUBLICATIONS

Antelius et al, "Room-Temperature Wafer-Level Vacuum Sealing by Compression of High-Speed Wire Bonded Gold Bumps" Jun. 5-9, 2011.

European Search Report, dated Oct. 17, 2016, from European Application No. EP 12856909.

* cited by examiner

THIN FILM CAPPING

The present invention relates to methods for sealing cavities in micro-electronic/-mechanical system (MEMS) devices to provide a controlled atmosphere within the sealed cavity.

BACKGROUND OF THE INVENTION

In the prior art of MEMS technology relating to the provision of sealed cavities housing functional components such as mechanical structures (e.g. inertial sensors, accelerometers, timing devices such as oscillators and gyros to mention a few), it has previously been difficult or even impossible to control the atmosphere in the cavities. The sealing of any vent holes or other openings in the structure has necessarily been performed using processes where the atmosphere is conditional on the process. This means that the sealing takes place either in vacuum, whereby the cavities have been sealed with a vacuum prevailing therein, or in some other atmosphere required by the process used (e.g. oxygen), and thus cavity atmosphere cannot be controlled at will.

However, often times it is desirable or even absolutely necessary to control the atmosphere in terms of pressure and/or gas composition, and in such circumstances the prior art methods fail. An example of the latter is a high performance mechanical structure that requires damping of some kind, preferably gas damping with a controlled pressure in order to avoid ringing or self-oscillation.

One solution to this problem has been devised by Stemme et al in published International Patent Application WO 2011/073393A2. The inventors therein provide a material having a larger dimension than a hole in a substrate to be sealed. A tool is used to press the material into the hole to seal it. Optionally the material is heated to melt it whereby the pressing action is made easier. This disclosure relates to the processing of flat surfaces exhibiting no topology.

In U.S. Pat. No. 4,744,863 (Guckel) discloses sealed cavity structures suitable for use as pressure transducers formed on a single surface of a semiconductor substrate (20) by, for example, deposition of a polycrystalline silicon layer. A cavity structure comprising channels is made. The channels extend from communication with the atmosphere to the cavity. The cavity may be sealed off from the external atmosphere by a second vapor deposition of polysilicon or silicon nitride, which fills up and seals off the channels, or by exposing the substrate and the structure thereon to an oxidizing ambient which results in growth of silicon dioxide in the channels sufficient to seal off the channels.

SUMMARY OF THE INVENTION

In view of the shortcomings of prior art methods discussed above the inventors have devised a new process for enabling controlled venting and thereby allowing total control of the atmosphere inside the cavities in MEMS structures, in a way that is efficient form a production perspective, and which allows use of standard equipment, thereby reducing manufacturing cost.

BRIEF DESCRIPTION OF THE DRAWINGS

The invention is described below in connection with the drawing figures in which different aspects of the invention are shown, and in which.

DETAILED DESCRIPTION OF THE INVENTION

In its most general aspect the invention provides a method of making a semiconductor device having a closed cavity. It comprises providing a semiconductor substrate, and providing a template on a localized area of the substrate defining the interior shape of a cavity. The is suitably a sacrificial material that can be etched away, and the template extends above the substrate surface, but can also extend down into the surface, such that the cavity can either be formed entirely on the substrate, or be formed by a combination of a depression in the surface and a space above the surface plane. When the template is made the next step is depositing a film over the entire substrate, and making at least one hole through the film down to the template. Then selective etching through said at least one hole is performed to remove the template whereby said cavity is provided. Sealing material is deposited in the hole and/or adjacent the hole without blocking the hole, and a desired atmosphere is allowed to enter into the cavity through said hole. Finally the sealing material is subjected to selected conditions such that the material is caused to enter the hole so as to seal the cavity.

A first embodiment of the present invention will now be described with reference to FIGS. 1-5.

Figure 1:
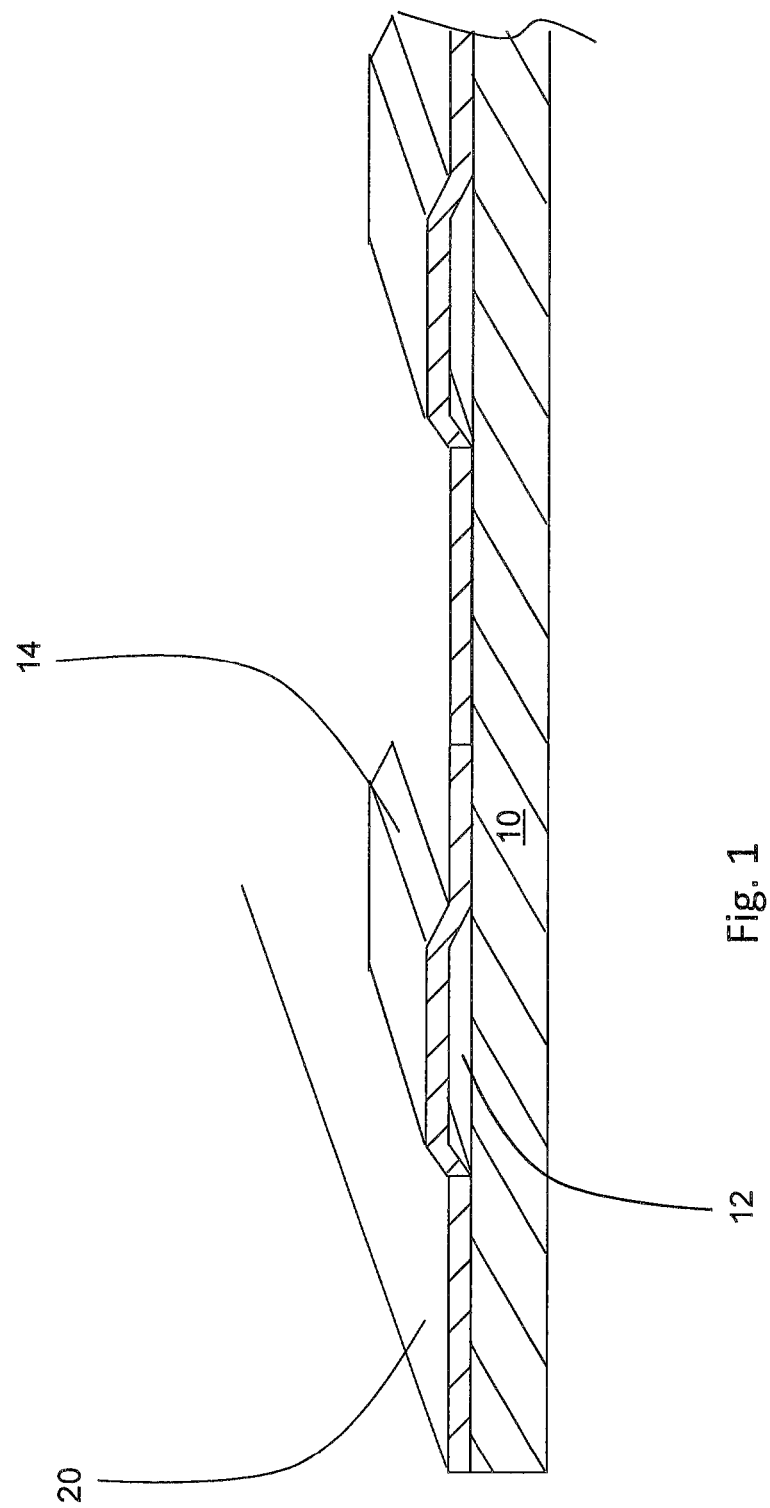
FIG. 1 illustrates an embodiment of a sealed cavity with a controlled atmosphere.

Thus, the problem to be solved is how to provide a structure like the one shown in FIG. 1, showing a partial cross-section in perspective view, namely a cavity 12 provided on a substrate 10 where the cavity is defined by a thin walled structure 14, protruding upwards from the surface of the substrate, the substrate thereby exhibiting a topology, and the cavity 12 exhibiting a controlled atmosphere, without causing damage to the thin walled structure in the process of sealing the cavity.

Obviously, the method according to the prior art document WO 2011/073393 to Stemme et al discussed in the Background section cannot be used as described in WO 2011/073393, since it would destroy the structure if the flat tool used therein were to be applied over the entire substrate. It can be noted that Stemme et al explicitly defines a cavity as being provided "in a substrate", as opposed to the present invention where the cavity is rather provided "on the substrate".

Therefore, in order to be able to provide a sealing action for a cavity provided on a substrate, and in which a desired and controlled atmosphere has been introduced, and which cavity comprises delicate structures forming the walls and roof of the cavity protruding up from a substrate on which the cavity is provided, thus providing topology on said surface, the inventors have devised a novel method and device that achieves this object.

Thus, in its most general form the invention comprises providing a substrate 10 having cavities 12 on the surface of the substrate, each cavity 12 having very thin walls 14.

Figure 2:
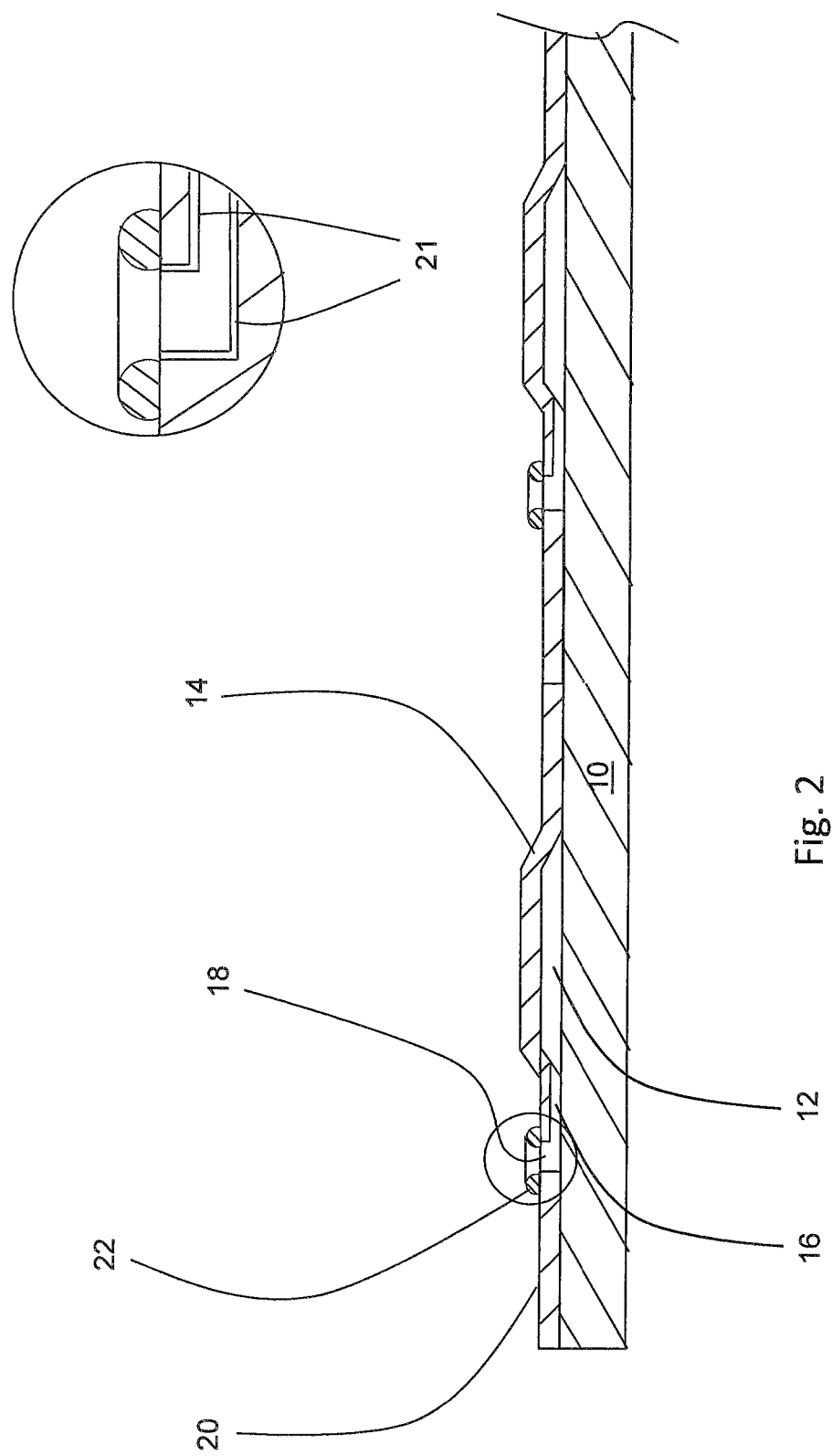
FIG. 2 shows a first step in an embodiment of the method.

FIG. 2 shows an embodiment in which a substrate 10 has been provided with a cavity 12 defined by a thin film capping structure 14. A channel 16 extending laterally to a point laterally displaced from the cavity beneath the substrate surface where there is provided a channel opening in the form of an opening 18 or a hole in the substrate surface and extending down to the channel.

It is not strictly necessary to provide a channel, although it may be practical from a manufacturing point of view. Instead it could suffice to provide simply an opening adjacent the cavity (not shown), to provide more or less direct access to the cavity from the outside.

Also, sealing material 22 has been deposited around the hole in a torus like shape. It is not strictly necessary to provide a torus shape, and the sealing material may be deposited as one or more "dots" or pads of material so long as the amount is sufficient to provide a sealing plug in the hole/channel.

Thus, by providing a fluid communication path 16 to the cavity 12 in this way, it is made possible to vent the cavity through the channel by purging it, suitably a number of times with a suitable gas or gas mixture so as to finally provide a desired atmosphere inside the cavity.

Once the desired atmosphere has been achieved inside the cavity the opening in the substrate can be sealed in a manner that does not affect the composition of the atmosphere inside the cavity. However, due consideration must be made to the general gas equation in that sealing at an elevated temperature will mean that the pressure inside the sealed cavity will be reduced when the temperature returns back to normal. Thus, if e.g. a pressure of 1 atm is required in the cavity at room temperature and the sealing takes place at about 300° C., the pressure during sealing should be about 2 atm. As an example can be mentioned accelerometers or RF switches for which damping is desirable at a cavity pressure of 0.1-0.5 atm.

The sealing is achieved by depositing a deformable material 22 close to/adjacent to the channel opening 18, suitably by any of PVD, CVD, plating, sputtering, including lithography/etching procedures, which is a non-exhaustive list of possible methods. The amount of material should be large enough that the hole, after the sealing has been performed, is filled to a substantial degree, which means that it preferably should reach down to the bottom of the hole i.e. to the "floor" of the channel 16. It is even more preferred that the material is displaced to some extent into and along the channel. It is of utmost importance that the seal be leak tight such that no gas will neither escape from the cavity nor will gas enter the cavity after sealing. Especially this is of importance if there is a pressure difference between the cavity interior and the environment.

In order to bring the material into the hole and possibly also into the channel, the sealing material can be subjected to various conditions causing this to happen.

Figure 3:
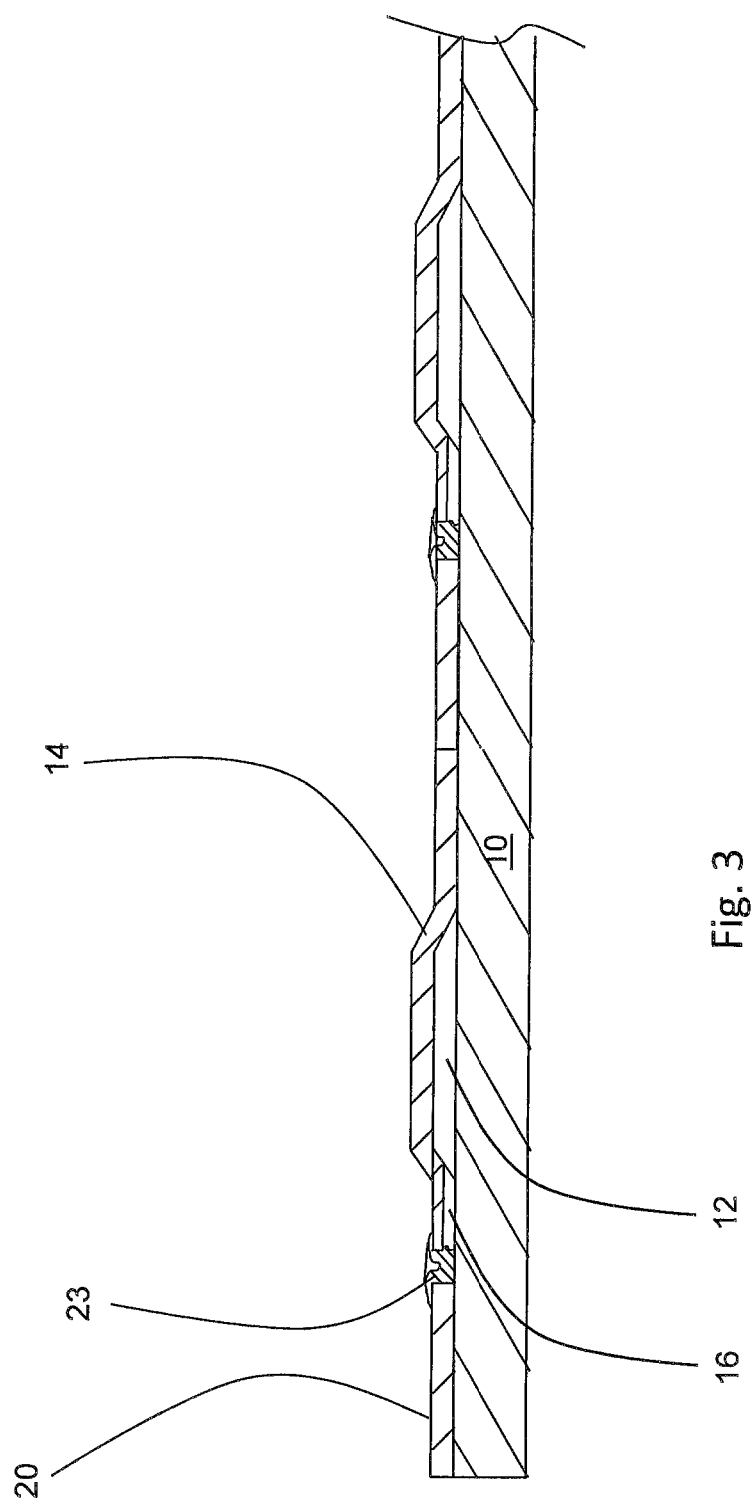
FIG. 3 shows a first step in an embodiment of the method.

In the first embodiment, illustrated in FIGS. 2-3, the material is heated to the melting point to cause it to flow into the hole and further into the channel. In FIG. 3 it is shown haw the sealing material (22 in FIG. 2) has been deformed by melting and has entered the opening 18, forming a plug 23 thereby effectively sealing the cavity. In the invention Au or AuSn are preferred materials, but the invention is not limited to use of these materials. Other possible materials that can be mentioned are AuSi, AgSn, CuSn, PbSn. For the purpose of causing this flow it is necessary to deposit a flow enhancing material in the hole. Such materials can be of the type wetting materials, e.g. metals, when the sealing material is e.g. AuSn. Possible metals for achieving the desired wetting are Au, Al, Ag, Cu, Ti, Cr, Ru, Pt. For a case where Au is used as the deposited material for sealing, it is suitable to provide a material that forms a eutectic with the deposited material, which could be polysilicon for Au as the deposited material. If Al is used as one component polygermanium could be used to form the eutectic. Optionally also the flow enhancing material can be deposited in the channel.

Another alternative could be to provide a non-wetting material, on the substrate outside the area where the sealing material is deposited. Thereby the sealing material would not be able to flow out on the substrate when melted and will be forced to flow don into the hole.

The insert in FIG. 2 in the circle is a detail of the hole showing a thin layer of a flow enhancing material 21 that extends down the walls in the hole 18 and also further on into the channel 12. If no such material is provided the surface tension of the molten material may prevent it from flowing into the hole. As indicated above, this material can be a wetting material in the form of a metal, or poly-silicon for the formation of a eutectic, and can be deposited by suitable methods such as, but not limited to, ALD, LPCVD, PVD, CVD, evaporation etc. In fact, what will happen in the case where p-Si is used is that the Au will strive to form a eutectic composition with the p-Si and thus the molten Au will "react" with the p-Si and be sucked into the hole.

FIG. 3 illustrates how a plug 23 has formed in the hole upon melting the sealing material.

An alternative method is to subject the deposited sealing material to a pressing action using a tool. This tool must be designed in accordance with the invention such that it only affects the deposited sealing material during the pressing operation, and will not cause damage to the delicate cavity structure protruding upwards from the substrate surface.

Figure 4:
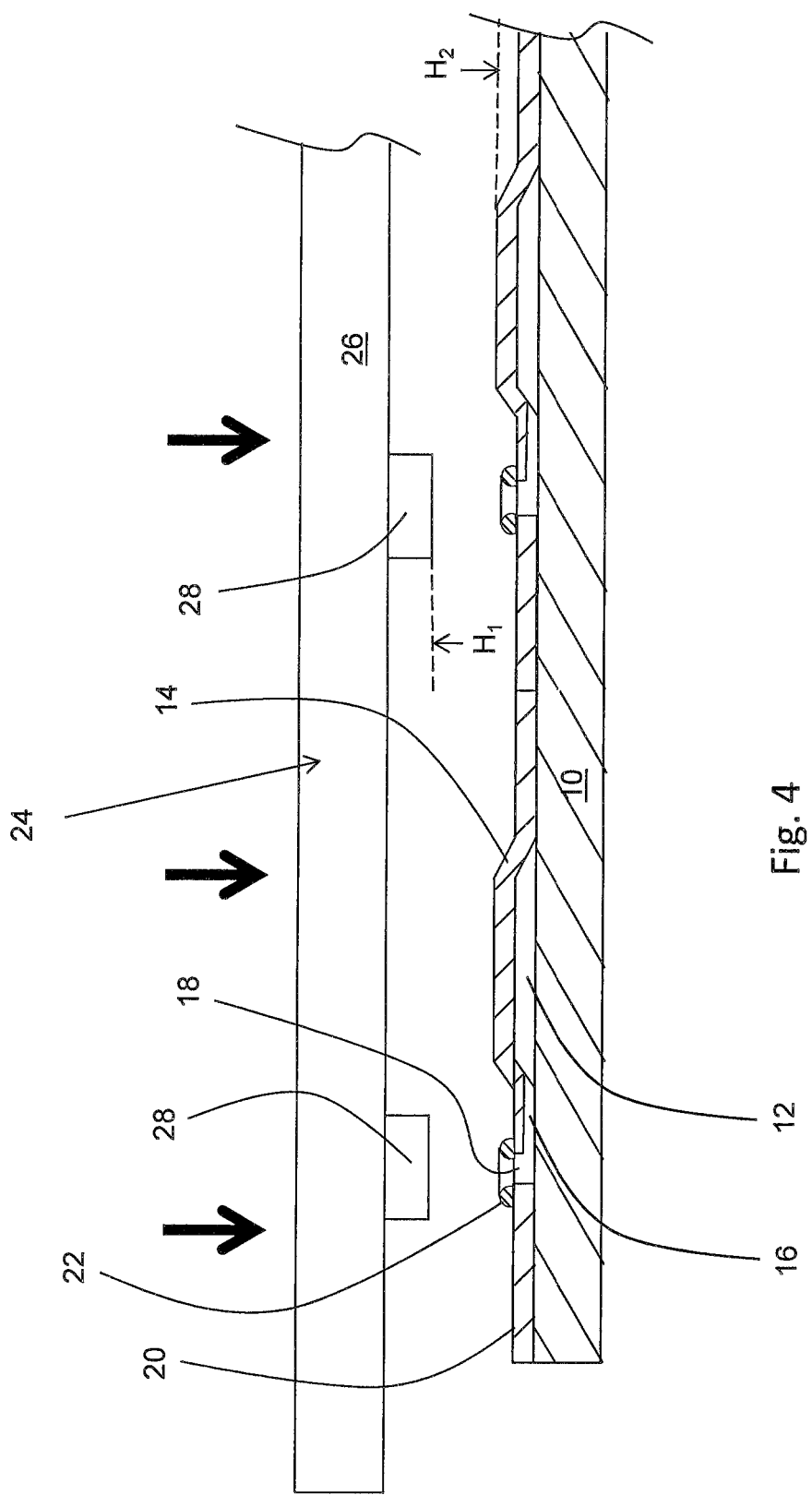
FIG. 4 shows a first step in an embodiment of the method.
Figure 5:
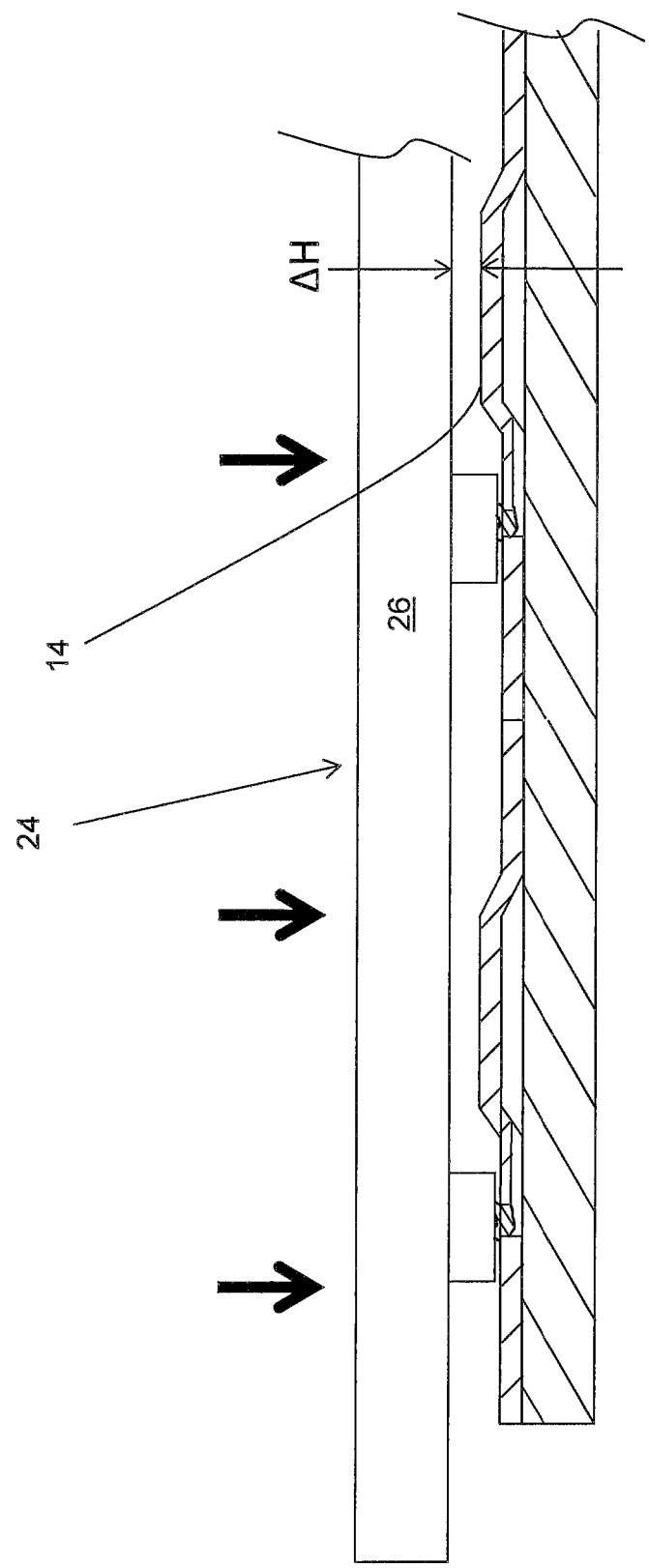
FIG. 5 shows a first step in an embodiment of the method.

In FIGS. 4 and 5 the pressing operation using the tool according to the invention is shown.

FIG. 4 shows a substrate 10 having been provided with a cavity 12 defined by a capping film structure 14. A channel 16 having an opening 18 in the substrate surface 20 is also provided.

Also, sealing material 22 has been deposited around the hole in a torus like shape. It is not strictly necessary to provide a torus shape, and the sealing material may be deposited as one or more "dots" or pads of material so long as the amount is sufficient to provide a sealing plug in the hole/channel.

The tool 24 for performing the pressing sealing operation comprises a flat plate 26 on which there are provided a plurality of stamping members 28, one for each sealing point. The stamping members 28 have a height $H_1$ that exceeds the height $H_2$ of the cavity housings, i.e. $H_1 > H_2$. The minimum clearance between the cavity top surface and the tool plate 26 should in preferred embodiments be >5 µm in order to ascertain that no debris in the form of particles or the like that could be sitting on top of the cavities will come into play and cause damages in the pressing operation. However, in preferred embodiments the clearance is larger, since it may well happen that debris particles can have size of more than 5 µm. Thus, in preferred embodiments the clearance is >20 µm, more preferred >40 µm, and still more preferred >80 µm.

Thereby, there will always be some free distance between the cavities and the tool plate 26 when the pressing action is finished.

Also the smallest dimension (i.e. width or diameter depending on shape) of the stamping members should be larger than the size of the deposited sealing material torus or pads, in order that the deformation in the pressing operation be complete and efficient. Oversizing the stamping members 28 also simplifies alignment of the tool in the pressing operation.

The aspect ratio is also to be considered. Suitably, it is at least 1:1 (height/width), more preferred 2:1, although it can be larger. However, if the stamping members 28 are made excessively long in relation to the width they may easily break in the pressing operation.

The stamping members 28 are laid out in a pattern matching the pattern of the holes to be sealed. Preferably, there is a 1:1 correspondence between the stamping members and the sealing locations, although this is of course not strictly necessary. An important feature is that there must of course not be any stamping members provided at locations where there are cavities, since in such case the cavities would be damaged.

Often the structures concerned, i.e. cavities having a controlled atmosphere are provided in large numbers on a substrate (or wafer). There could be as many as 100,000 such structures provided, each associated with a hole to be sealed. For ease of production it would of course be convenient and indeed preferred if all holes could be sealed in one operation.

Thus, in a preferred embodiment of the invention, the tool 24 comprises a flat support plate 26 of a size corresponding to an entire substrate. On the support plate 26 there are provided stamping members 28, such that the sealing operation can be performed in one pressing step. This would require one stamping member 28 for each hole to be sealed.

The material for the stamping members is of importance. It must of course not react with the sealing material, in which case it would not be possible to remove the stamp after sealing without damaging the seal. Thus, one aspect to consider is to use a material composition that cannot form bonds with the seal in the sealing operation. Alternatively, this effect can be achieved by providing a coating of a suitable material on the surface of the stamping members. Such materials can be of the type SiO or SiN, although similar other materials can of course also be used.

In order to further reduce or even eliminate the risk of sticking to the sealing material, the surface of the stamping members can be rugged, i.e. it can exhibit a degree of surface roughness. However, the surface roughness (expressed in µm) may not exceed the thickness of the deposited sealing material, since in such case the sealing material might simply become deformed and not actually forced into the hole. Thus, preferably the surface roughness should be at least 25% smaller than the thickness of the sealing material.

Alignment of the stamping tool with the sealing structure is of course necessary. However, since the invention can be implemented in a wafer bonder machine, and alignment procedures are built-in in such equipment, this will not pose a problem to a skilled man.

It is of course possible to provide smaller tools, i.e. plates covering only a fraction of a substrate, and thus only a fraction of the holes, in which case the method would involve a repeated pressing operation. This is however undesirable from a production point of view since repeated processing will multiply the operation time, and also the tool would have to be realigned to the hole pattern between each pressing operation, which would require extra process steps, and thus cause undue production delays.

There are specific applications such as when two different components requiring different atmospheres inside a cavity are desirable. As an example can be mentioned inertial sensors.

Such sensors comprise gyros (requires high vacuum) in combination with accelerometers requiring gas damping (low vacuum), i.e. the case when an accelerometer and a gyro are provided together on a chip. In total this gives six degrees of freedom. In such cases the sealing process suitably is performed in two steps, i.e. a first step introducing a first atmosphere in some cavities followed by a sealing, and a second step introducing another atmosphere in remaining cavities followed by a sealing.

There are several possible combinations of procedures within the inventive concept.

A first variant is to provide sealing material having a high melting point for a first plurality of holes to be sealed, introducing a desired atmosphere, and melting the material to seal. Then a second sealing material having a lower melting point is provided to the remaining holes, again a desired atmosphere, different from the first atmosphere is introduced in the cavities, and sealing is performed at he lower melting pint whereby the first seals will be unaffected due to the higher melting point. In this way different atmospheres are obtainable in different cavities.

It is also possible to perform a sealing by stamping in two consecutive operations. However, in case of stamping of course it would not be required to use different sealing materials. Instead one would used different and complementary stamping tools, such that a first stamp seals a first plurality of holes, and a second stool seals a second plurality of holes.

Of course one could combine the two procedures, such that a first plurality of holes are sealed by, melting and a second by stamping or the other way around.

Of course it is also within the inventive concept to repeat sealing more than twice, and in principle there is no limit other than practical economical limitations on how many times it is repeated. In such cases one would have to use several different tools having complementary lay-outs of the stamping member patterns, or several different materials with differing melting points, or a combination of these methods.

For example with bio-chips and opto-chips it could be of value to provide cavities wherein several different gases having different spectroscopic properties are confined. Also, the thermal properties of the confined gases could be made to vary over a range of values, such as different thermal conductivity.

The method then comprises placing the substrate having the cavity structures on a suitable support (not shown), positioning the tool in alignment with the wafer such that the stamping members 28 are located above a respective hole to be sealed. The tool is then lowered to be brought in contact with the wafer and a force is applied to cause the sealing material to be compressed and deformed whereby it flows plastically down into the hole and further into the channel if enough sealing material is provided, as shown in FIG. 5. As can be seen, there is a spacing ΔH between the cavity structure 14 and the actual tool support plate 26 which prevents the cavity from being crushed.

The entire process can be implemented in a standard wafer bonder machine (from i.a. EVG, Süss), requiring only straight forward modifications, which could be implemented by a skilled man without inventive work.

FIG. 6a-g illustrates the invention in another form. Thus, a substrate 60 is provided on which is formed a template 62 for the final structure, said final structure comprising a cavity, see FIG. 1a. The template 62 suitably is formed from an etchable material, e.g. resist although any etchable material that can be applied to the substrate is possible.

The template 62 defines not only the shape and dimensions of the cavity, but optionally also provides the template 62a for a channel to be in fluid communication with the cavity. The template is suitably made by appropriate masking and deposition of the etchable material according to the mask pattern, and then the mask is removed. Standard lithographic techniques can be used, although any other method that can provide a template as desired is of course usable.

As mentioned previously the template could be made to define not only a cavity on the surface of the substrate but can also comprise a depression extending down into the substrate. This is illustrated with ghost lines in FIGS. 6e-g. Suitably the template having this design is made in two steps, i.e. a first step providing a depression and a second of filling it with a sacrificial material, before the template for the part extending above the surface is made. However, it is possible to make the entire template, i.e. both depression part and the upwards extending part simultaneously, but it may require slightly more elaborated lithography, i.e. masking and etching.

Figure 6:
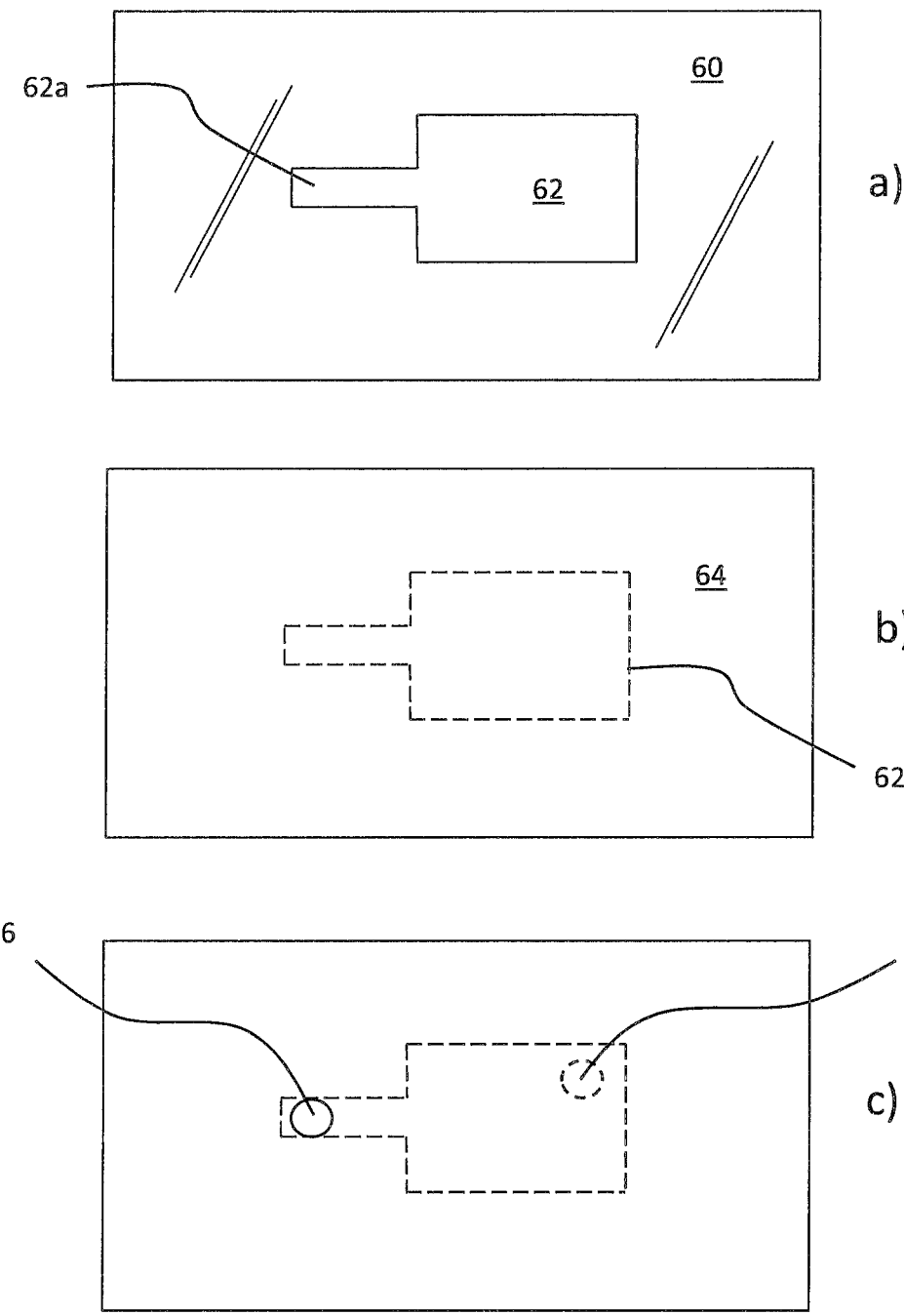
FIG. 6a-g illustrates a process sequence for a general aspect of the method.
Figure 6:
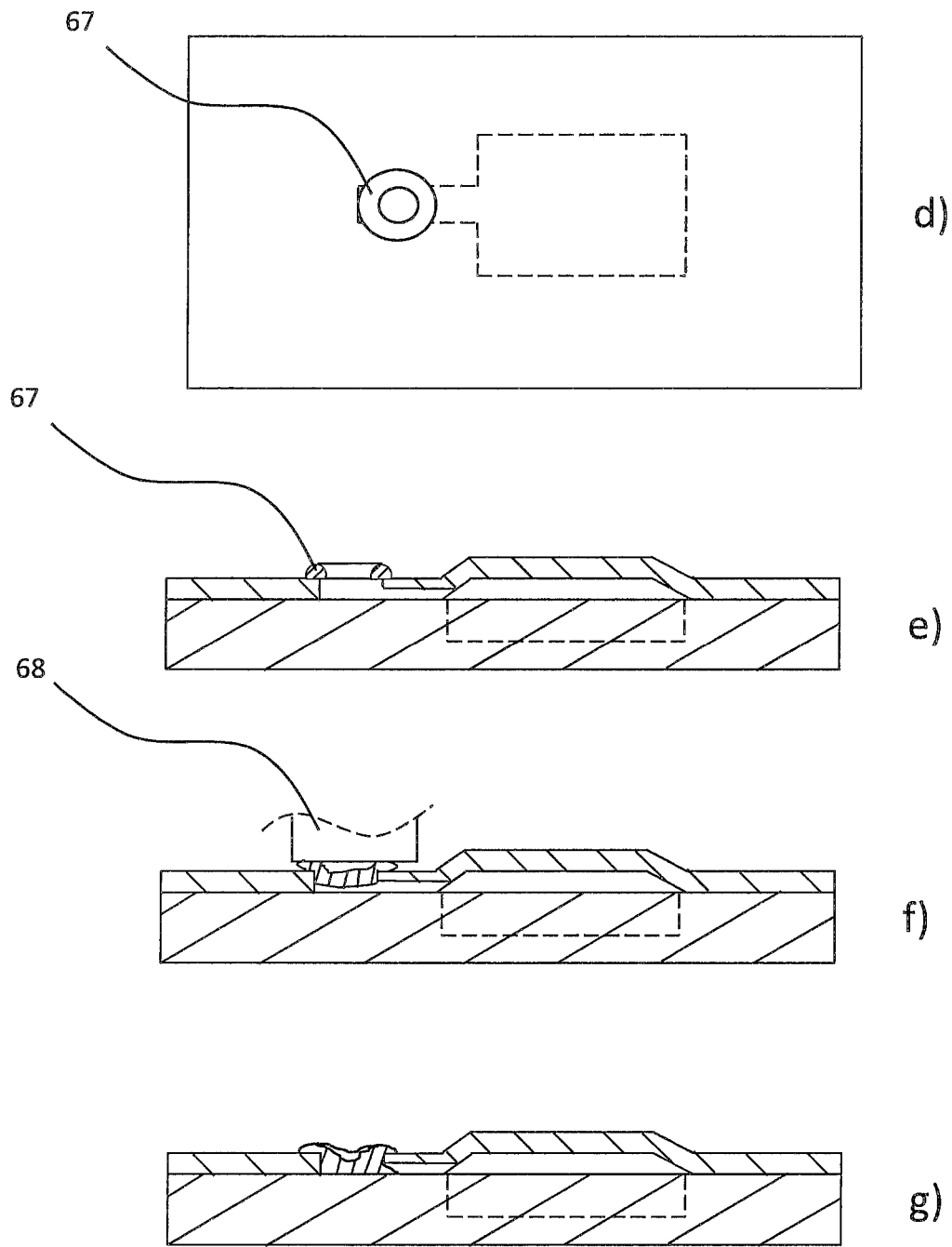

When the template 62 has been made, suitably the entire wafer is coated with a layer 64 of a material that will form the final structure, i.e. the walls of the cavity. In FIG. 6b the template being covered is shown in ghost lines 62' since it is no longer visible.

In order to make the cavity obviously the etchable material of the template must be removed from under the layer 64. Therefore a hole 66 is made in the layer 64 extending down to the template, in FIG. 6c it has been made through that portion 62a of the template defining the channel. The reason for providing the hole 66 at this particular location and not above the cavity to be is that the sealing process might cause damage to the rather delicate structure forming the roof of the cavity. Also, the actual sealing process could contaminate the cavity.

However, in principle the hole can be made at any other location, and the invention is not to be construed as limited to making the hole at the template portion 62a forming the channel. In an alternative embodiment a hole 66' could be made in the "roof" of the cavity to be made, as indicated by a circle in broken lines.

When the hole 66 (or 66') has been opened up an etchant is applied through the hole whereby the template material is etched away. In order to empty the cavity thus made rinsing is provided and the cavity is also dried out e.g. by exposing the structure to an elevated temperature.

In order to provide a desired atmosphere inside the cavity, the entire structure is placed in a room providing such atmosphere. This could be a selected gas such as nitrogen, oxygen, $CO_2$, or any other desired gas. The pressure can also be controlled by letting the gas of interest exhibit the pressure in question.

When the cavity is filled with the desired gas at the desired pressure, it must be sealed hermetically. This can be done in the following way according to the invention.

A deformable material is deposited at a position adjacent the hole, suitably circumferentially around the hole 66, although this is not strictly necessary. The material could be applied as a single spot or as a plurality of spots around the hole but in close proximity to the hole. In FIG. 6d the material is shown as a circular deposition 67 around the hole. FIG. 6e illustrates the same state as FIG. 6d but in cross-section.

By "deformable" is meant that the material when subjected to appropriate conditions will be caused to enter the hole so as to seal it. It can either be deformed by melting it or it can be deformed by using a tool to press on it thereby physically (plastically) deforming it such that it is forced down into the hole to seal it.

A suitable and preferred material for the sealing is a solder based on gold and tin (AuSn) which is soft and has a reasonable melting point (284° C.). However, other materials are possible, such as other tin base alloys, e.g. PbSn, CuSn, AgSn, AuCuSn etc.

For the embodiments using compression, pure metals which are soft enough to be easily mechanically deformable are suitable as sealing materials, i.a. metals such as pure Au or Al, Ag, Cu, Ti, Cr, Ru, Pt.

The embodiment in which deformation is by using a tool 68 to plastically deform the sealing material is illustrated in FIG. 6f, and the embodiment wherein the material is melted is illustrated in FIG. 6g.

In the following description with reference to FIGS. 7-16, an embodiment will be described that comprises a mechanical component with a free-hanging member that deflects in operation and which is enclosed in a cavity with controlled atmosphere. Examples of such mechanical components that can be mentioned are switches, resonators, gyros, accelerometers and inertial sensors or the like.

Figure 7:
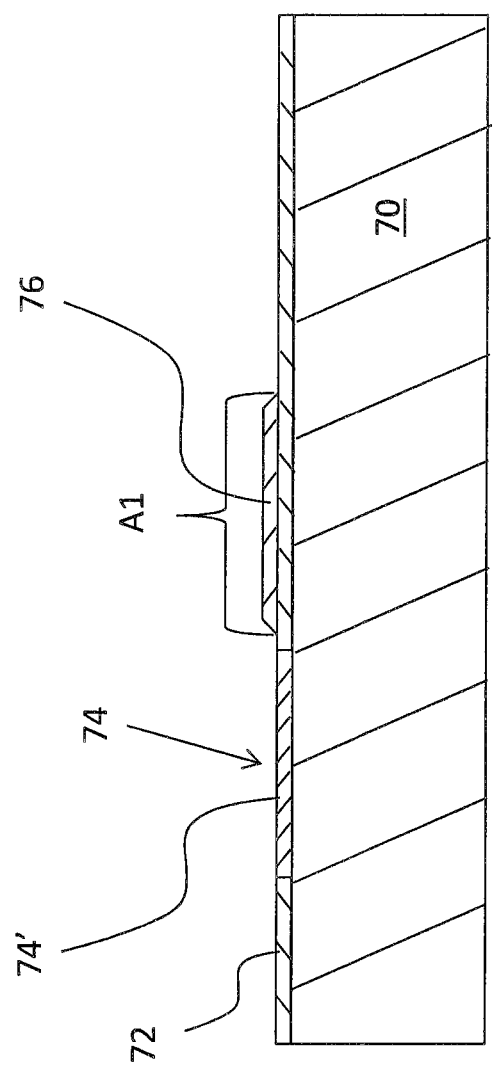
FIG. 7 shows a first stage of a process.

FIG. 7 shows a semiconductor wafer 70, suitably silicon, on which an oxide layer 72 has been provided. In the oxide layer a recess 74 has been made by suitable lithographic or other methods, which are within the competence of the skilled man and thus, details of the lithography performed in the process described will not be disclosed herein. This recess will form the inventive venting channel in the finished structure. In order that the channel be preserved during continued processing it is filled out with a suitable sacrificial material 74', that can easily selectively be removed at the end of the process so as to open up the channel for venting.

In order to make the mechanical component a first sacrificial material 76 is deposited on a local area A1 so as to form a support for the deposition of further material that subsequently will form the mechanical component. The shape of this local area A1 is suitably defined by lithographic methods, i.e. forming a mask and depositing the material and then removing the mask.

Figure 8:
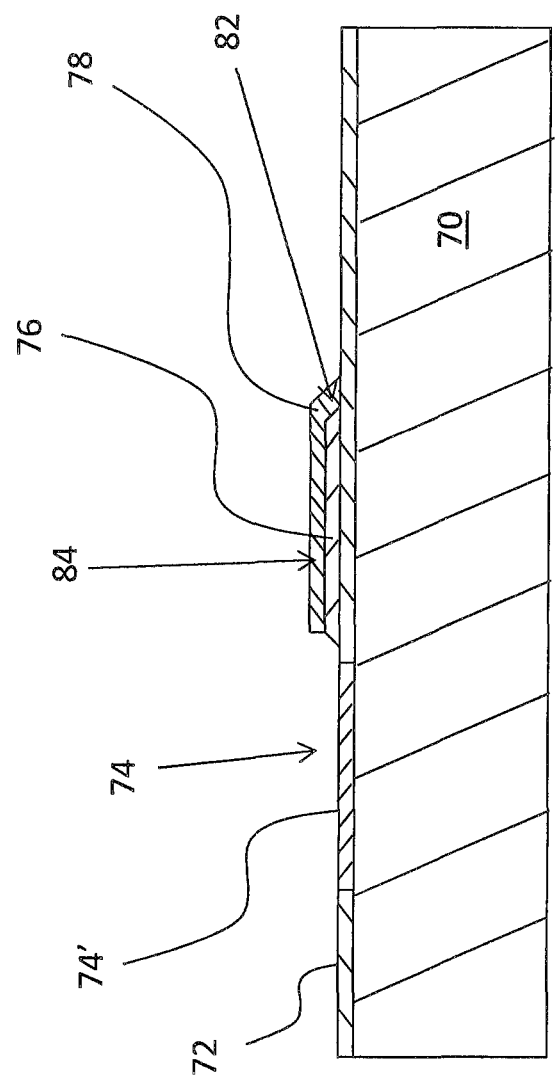
FIG. 8 shows a first stage of a process.

Thus, as shown in FIG. 8, after suitable masking the material 78 for the mechanical component structure is deposited on the first sacrificial material 76. As can be seen, for this particular embodiment, the material is deposited on top of the sacrificial layer 76 and only at one edge the material extends down to the oxide 72. This will provide a post or support 82 that carries a cantilevering structure 84 at a distance above the oxide surface 72.

Figure 9:
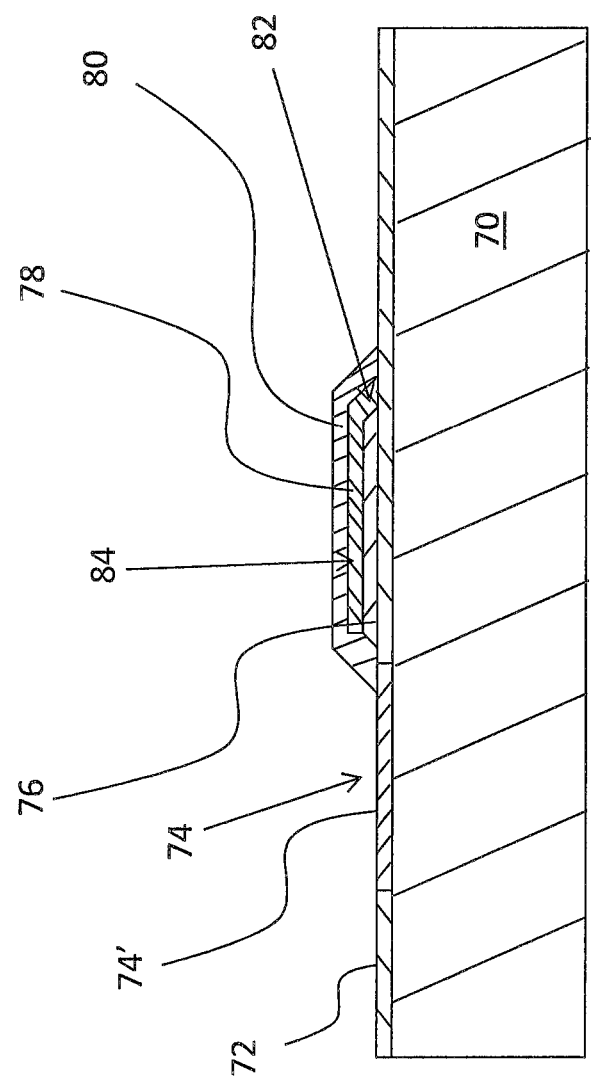
FIG. 9 shows a second stage of a process.

Then, as also shown in FIG. 9, a second deposition of sacrificial material 80 is performed so as to cover the entire mechanical component structure 82, 84, thereby defining a volume that subsequently, as will be described below, will form a cavity surrounding the mechanical component 82, 84. It is also important that the second sacrificial material extends to at least partially cover or overlap the recess 74 in the substrate, such that there will be a fluid communication between the cavity and the channel that are to be made subsequently.

Figure 10:
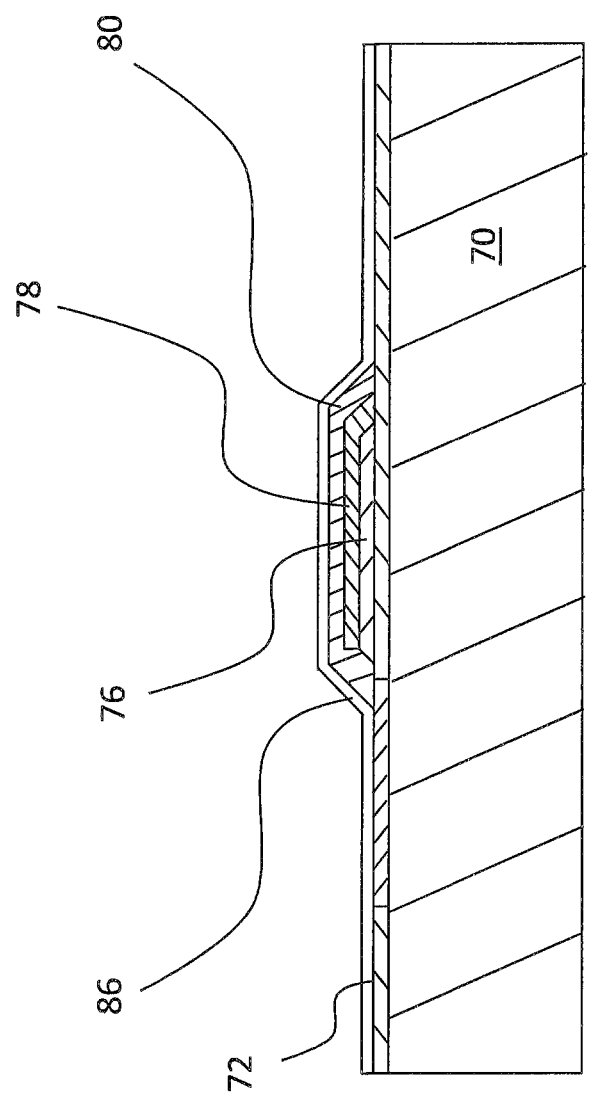
FIG. 10 shows a third stage of a process.

As a next step, shown in FIG. 10, there is deposited a film 86 over the entire structure. A thickness of 1-5 µm is suitable. This film 86 will form the "roof" and "walls" of the cavity in the final product.

Figure 11:
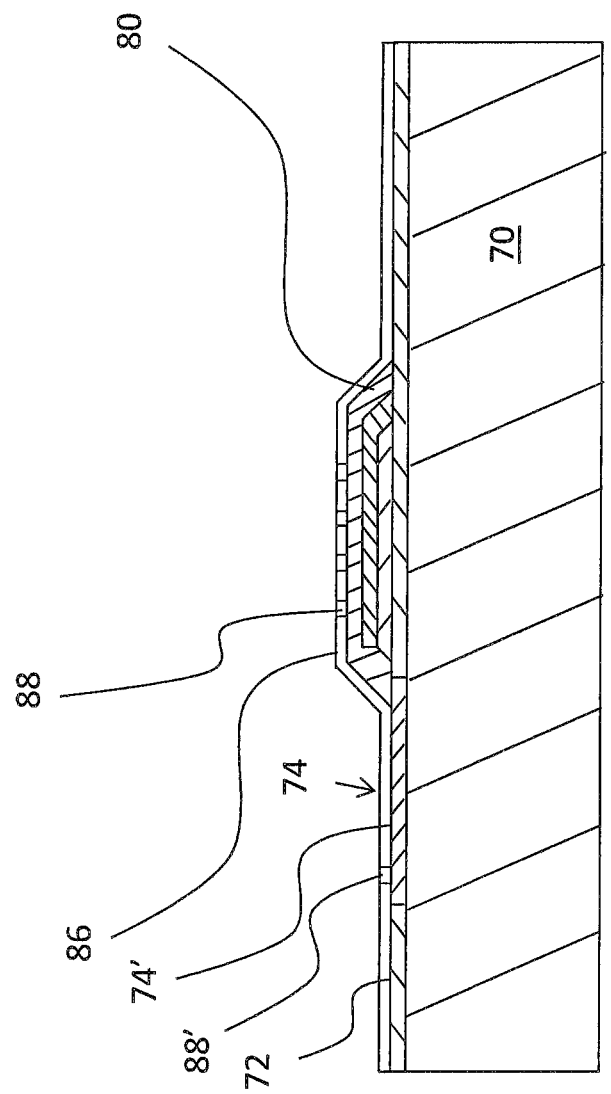
FIG. 11 shows a fourth stage of a process.
Figure 12:
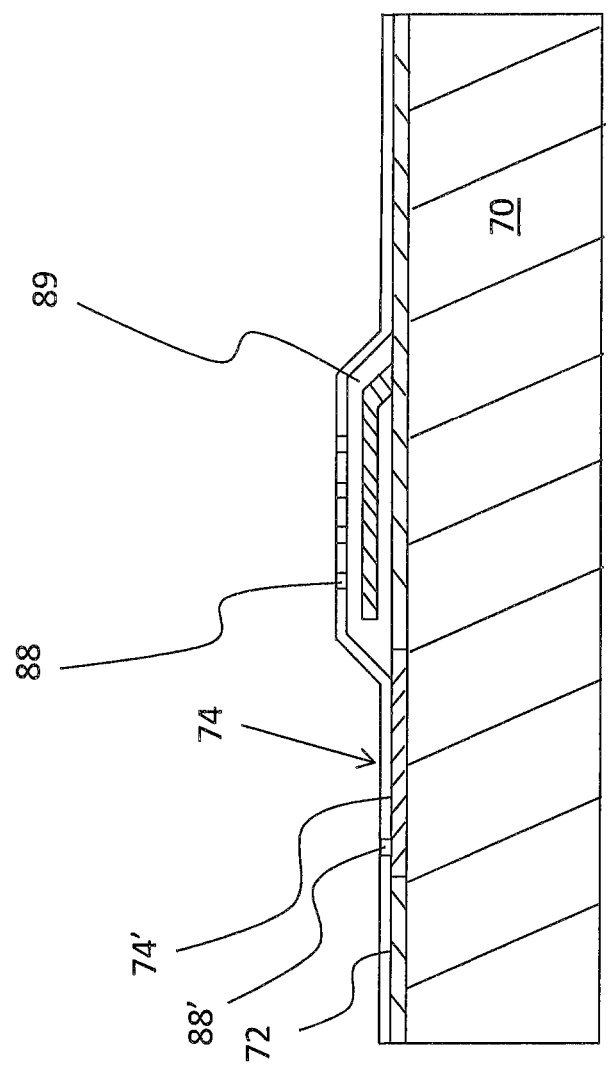
FIG. 12 shows a fifth stage of a process.

In order to create the cavity obviously the sacrificial material 76, 80 must be removed from beneath the film 86. This is achieved by an etching procedure which requires access to the material. To this end holes 88 are made, as shown in FIG. 11, through the film 86 to extend down to the sacrificial material in order that an etchant be able to attack it and dissolve it. In one embodiment a further hole 88' can also be made at the same time as the etch holes 88. This further hole 88' is made through the film 86 at a location above the recess 74, and is used in a later step, to be described. However, the hole 88' can also be made separately at a later stage, and it is assumed below that the hole 88' is not made at the same time as the holes 88. Thus, when the holes 88 have been made, an etch is applied through the holes, suitably a wet KOH etch, but other methods are equally possible, so as to dissolve the sacrificial material 76, 80. Thereby the cantilevering member 84 will become free-etched and will have a possibility to move inside the cavity thus formed, as shown in FIG. 12.

Now that the cavity is made it is desired to provide a controlled atmosphere inside the cavity. However, the etch holes must be sealed, and the only possible way of sealing them is to deposit material in vacuum, and as a consequence, the only atmosphere that is possible to obtain is vacuum.

Figure 13:
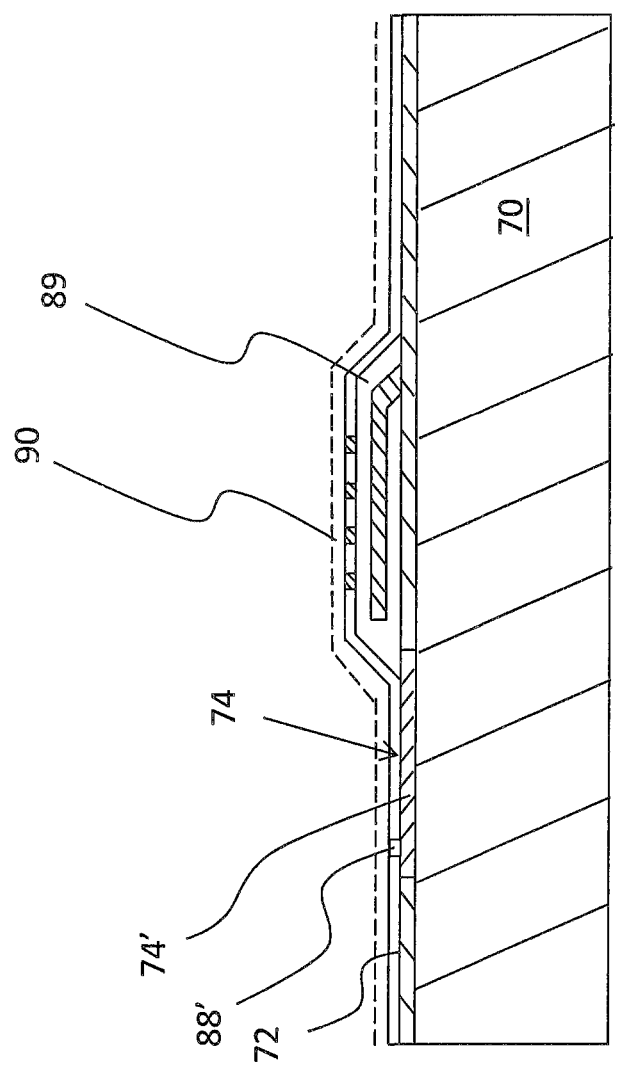
FIG. 13 shows a sixth stage of a process.

Therefore, there is provided for a venting of the cavity through a channel which can be sealed in any desired atmosphere. However, the etch holes 88 must at any rate first be sealed, which is then performed as usual in vacuum, by depositing material over the entire structure whereby the holes, in view of their minute size (about 1-5 µm in diameter), very quickly will become "clogged". Commonly the aspect ratio (width/depth) for these holes is 1:1. This stage of the process is shown in FIG. 13. Of course inevitably some material will enter through openings and into the cavity, as a consequence of which the holes must be located such that the deposited material does not hit the cantilever structure 84 (or whatever structure is provided inside the cavity), in which case its function will be jeopardized.

Now, when the cavity is sealed, it may be desirable to provide increased stability by depositing a mechanical layer 90 over the entire substrate. This is however not strictly necessary for the invention, and is thus only a preferred embodiment, and therefore this layer is shown in ghost lines in FIG. 13 only. If a mechanical layer 90 is provided then the hole 88' would not have been made simultaneously with the etch hole 88, since it would be closed again by the material in the mechanical layer 90.

Below it is assumed that the mechanical layer is provided, but not shown.

Figure 14:
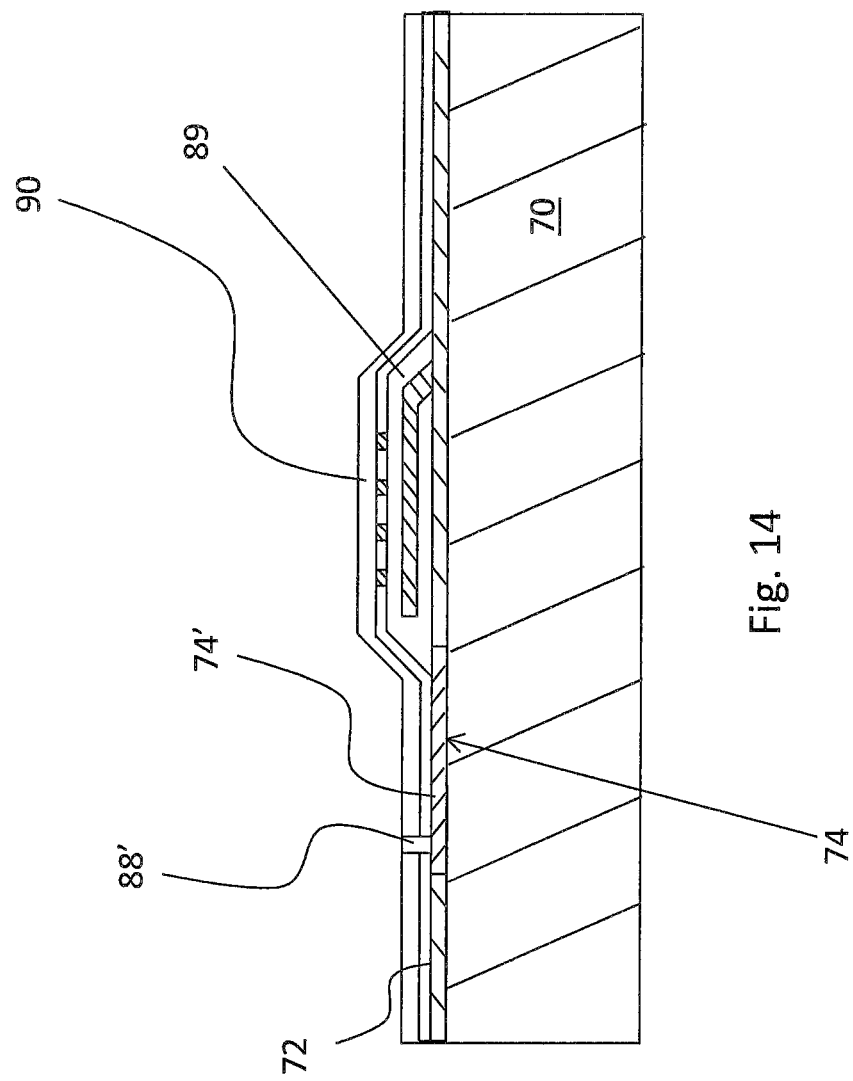
FIG. 14 shows a seventh stage of a process.

Therefore, it is necessary to open up a hole 88' through the mechanical layer 90 and the thin layer 86 down to the recess 74 with the sacrificial material 74' therein, as shown in FIG. 14.

Reference is made to FIG. 15, and again, as previously done for making the cavity, a wet KOH etch is applied through the hole 88' to dissolve the sacrificial material 74' in the recess 74, thereby providing a channel 91. Due to the slight overlap of the sacrificial material 76, 80 defining the cavity 89, and the recess 74, there is now provided a fluid communication to the cavity 89, from the hole 88', via the channel 91, as indicated by the arrow.

By virtue of the channel 91 communicating with the cavity 89 through the hole 88', it is now possible to expose the entire structure to any desired atmosphere to provide such atmosphere inside the cavity 89.

Now, the hole 88' need not be sealed by vacuum deposition, but in fact the sealing can be performed in the current atmosphere, by a method which will now be described.

Since the hole 88' is located on an area outside of the area where the cavity is located one does not have to take into consideration the very delicate and brittle structure forming the cavity. Thus, the inventors have devised a method that is based on the use of a deformable material that when subjected to certain conditions deforms and enters into the hole 88', thereby sealing it.

Figure 15:
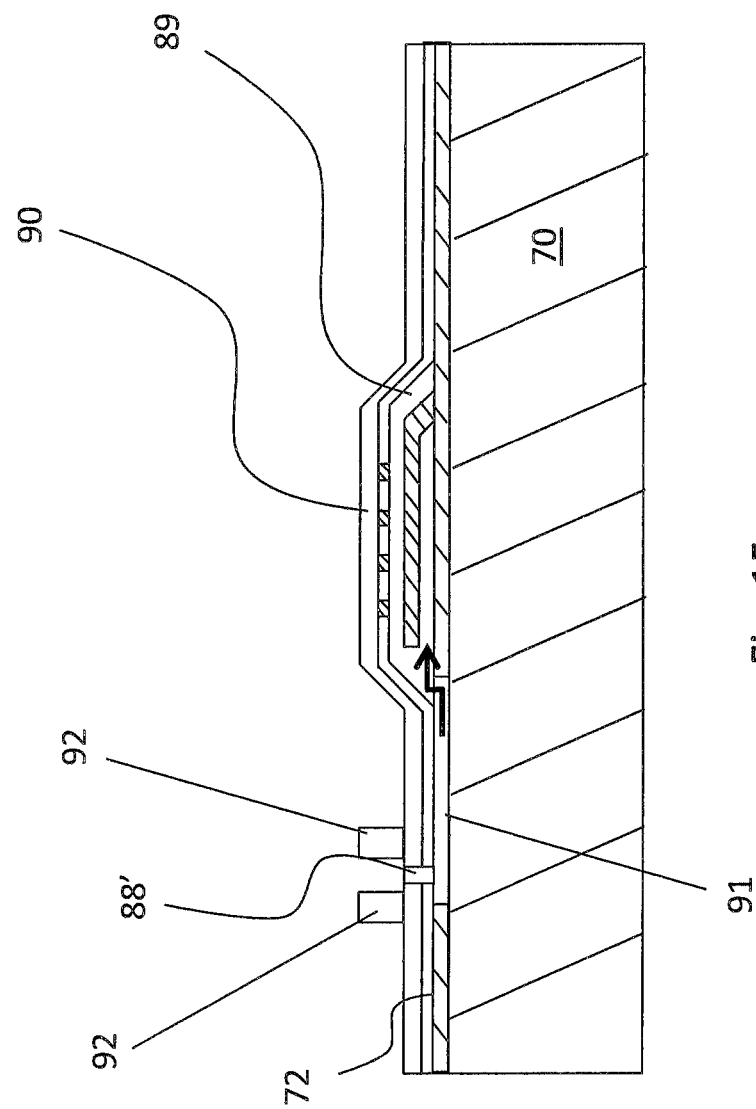
FIG. 15 shows a eight stage of a process.
Figure 16:
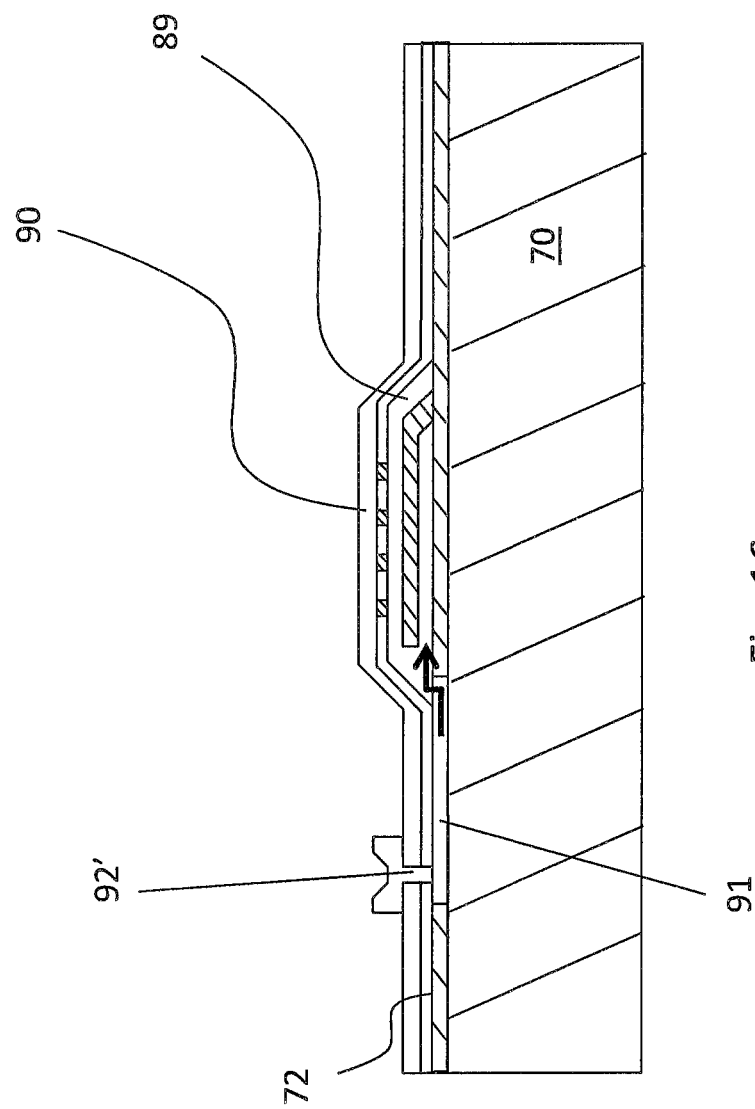
FIG. 16 shows a ninth stage of a process.

As already discussed in connection with FIG. 7 suitably a solder based on gold and tin (AuSn) is preferred. This solder is deposited by suitable methods such as ALD, PVD, CVD, plating, evaporation etc., in close proximity to the hole 88', in the example shown as two solder members 92 in the form of pads/pellets/pillars located opposite each other at the very edge of the hole 88', as shown in FIG. 15. Heating the structure to the melting point will cause the solder members 92 to flow, possibly aided by capillary force, down into the hole 88' where it effectively forms a sealing plug 92'. This is shown in FIG. 16, wherein the pellets/pads 92 have coalesced into a plug 92' effectively sealing the hole and thereby the cavity 89.

Of course it is equally possible to use the stamping procedure described earlier in this embodiment too.

In a further embodiment the vent hole for the venting channel is provided as follows.

Figure 17:
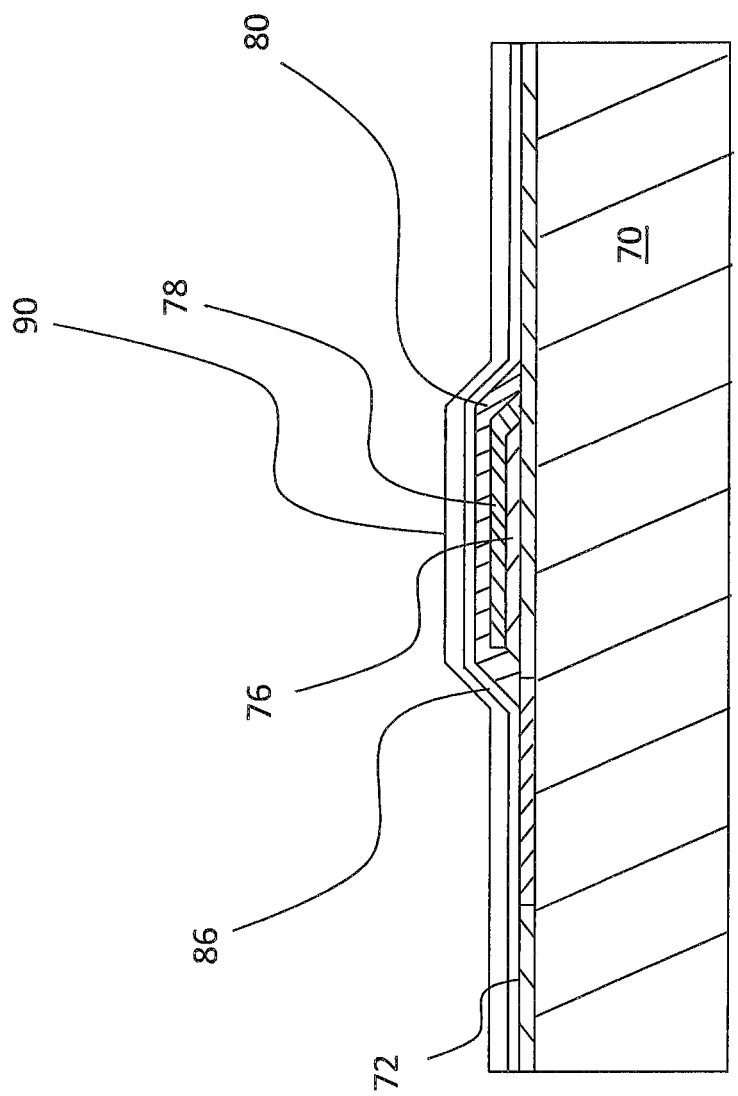
FIG. 17 shows one step of an alternative way of providing a sealing material.
Figure 18:
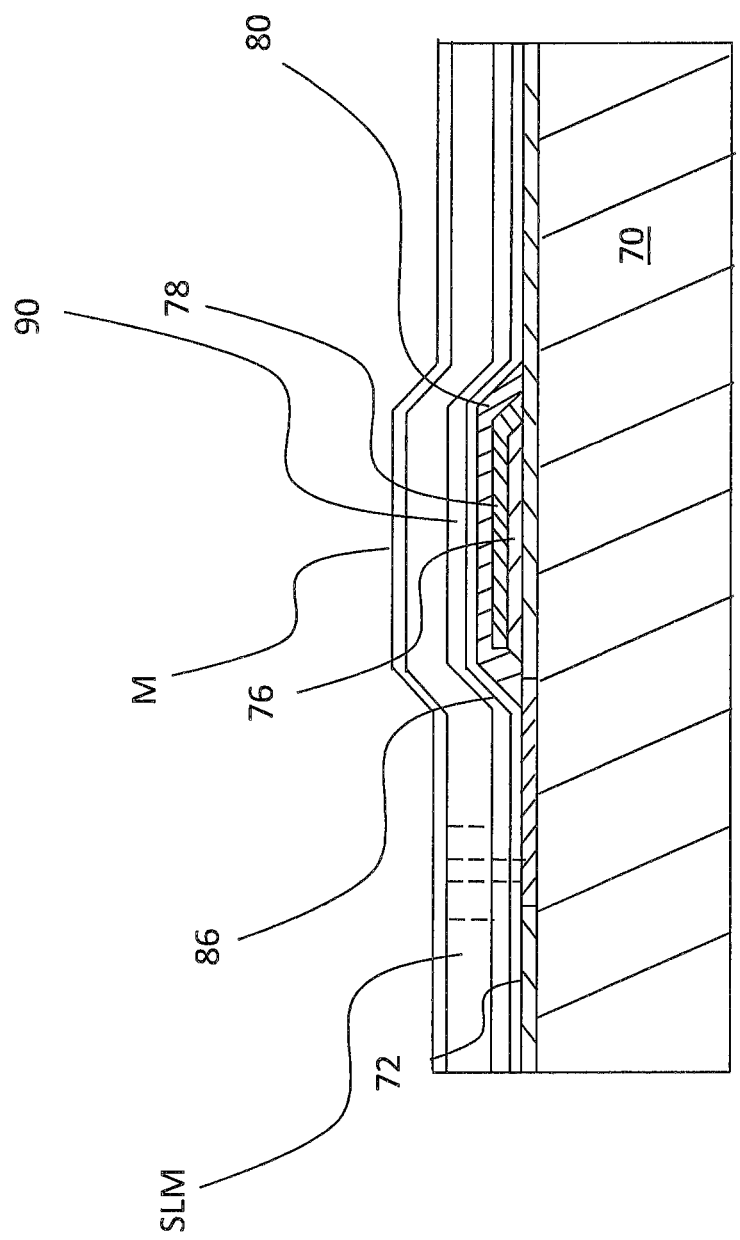
FIG. 18 shows a further step of said alternative way.

When the structure shown in FIG. 17 is provided (the optional layer 90 is also shown, but is not necessary for this embodiment either), the entire wafer (or at least a substantial part of the wafer) is coated with a layer SML of the metal selected for the sealing, shown in FIG. 18.

Then an etching mask M is deposited, suitably a resist for lithographic pattern definition, see FIG. 18. Then, in one embodiment the shape and location of the sealing material member is defined by lithography, the pattern developed, and the unwanted metal is etched away to provide sealing material pads SMP provided at the locations of the holes to be made. Next, the venting/etch hole EH is defined by lithography and the holes are opened up through the sealing material and the substrate down to the venting channel. The lithographic definition is schematically symbolized by vertical broken lines in FIG. 18. A suitable etch is applied to remove the material to clear the channel and the cavity from the material inside. This is schematically illustrated by arrows in FIG. 20.

Alternatively, the hole EH is made through the sealing material layer SML before the sealing material pads are made, i.e. the process is reversed. The end result will be the same, i.e. the structure shown in FIG. 19, whereupon the etching to open up the channel and cavity is performed.

Thus, in the method the sealing material can be patterned and etched to provide sealing material pad(s) located at the positions of the hole(s), either before or after the holes have been made.

Figure 19:
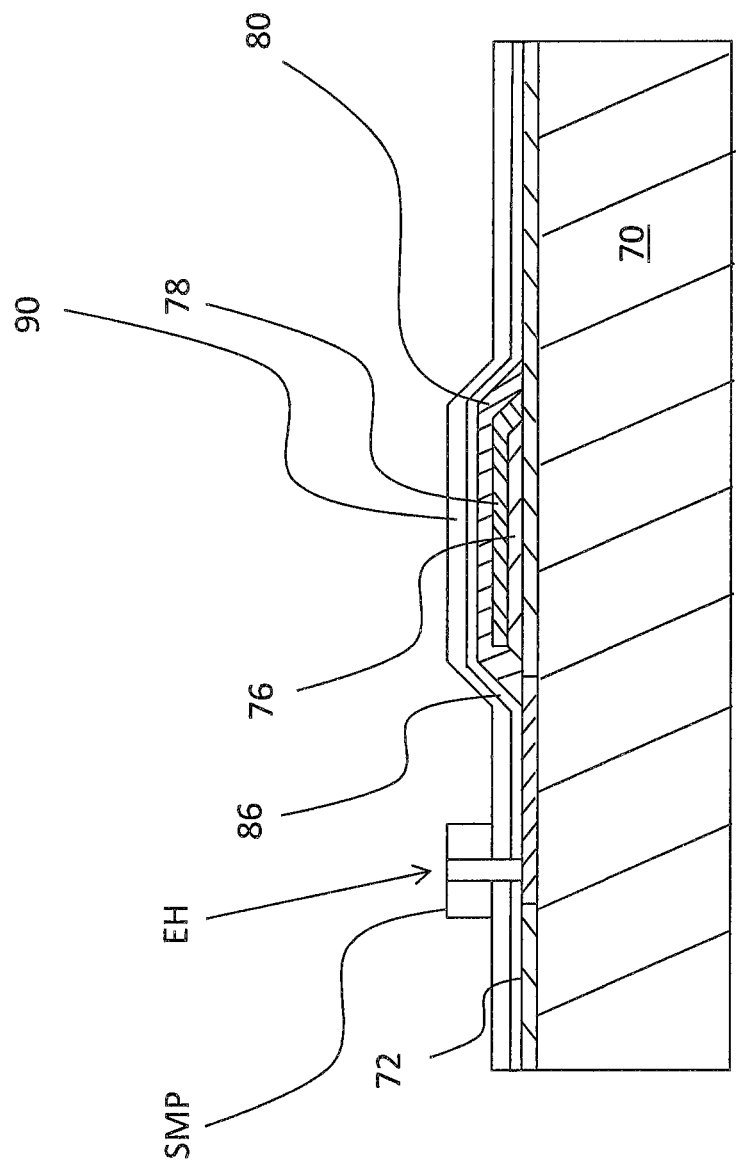
FIG. 19 shows the result of the provision of the sealing material according to the alternative way.
Figure 20:
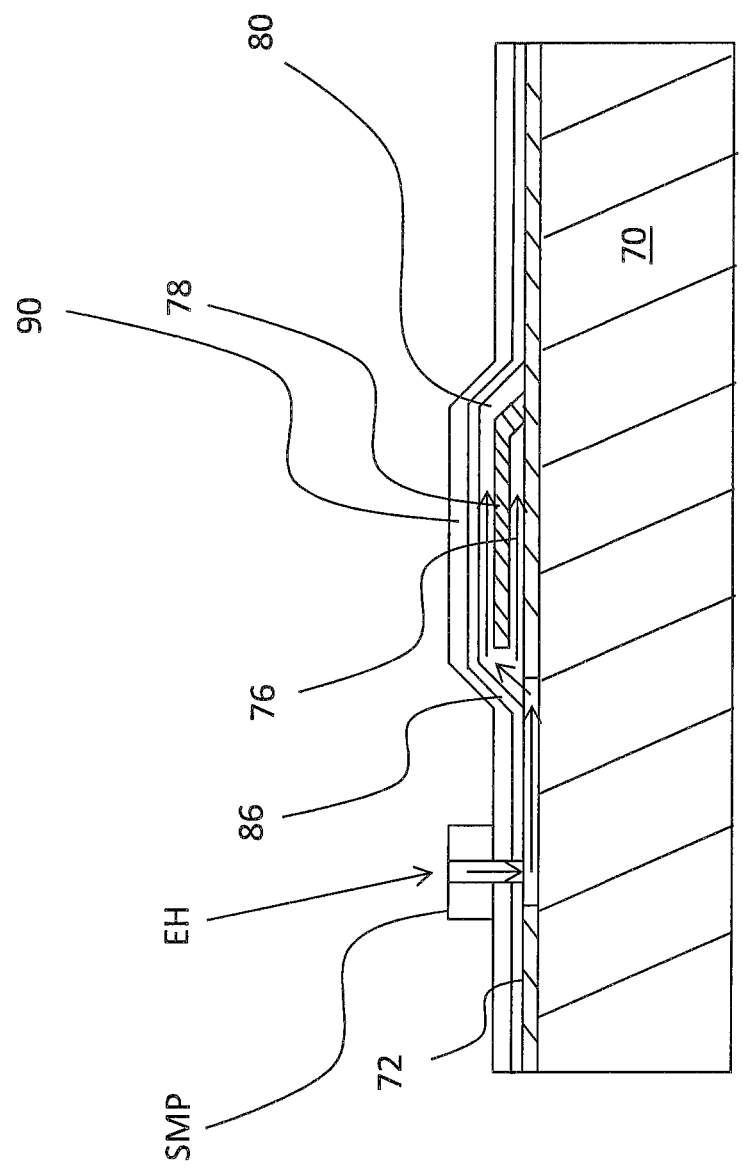
FIG. 20 is illustrative of the venting in the alternative way.
Figure 21:
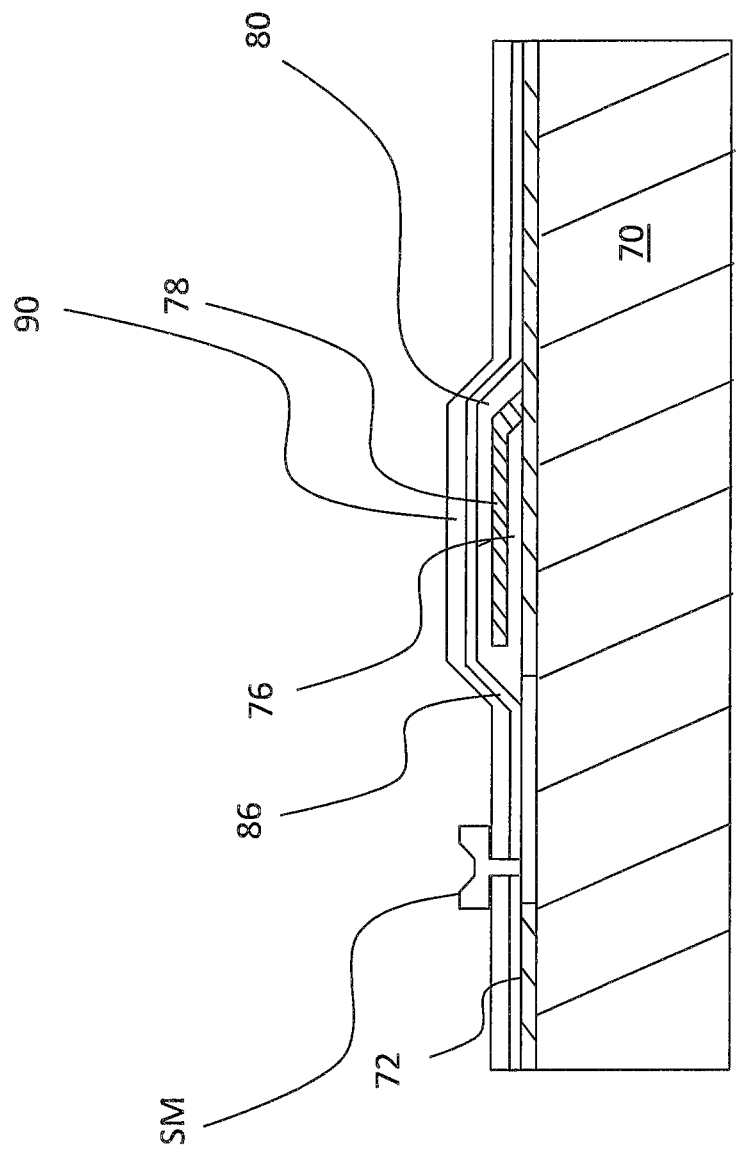
FIG. 21 shows the end result of the alternative way.

When the sealing material SMP is provided as shown in FIGS. 19-20, and the channel and cavity have been opened up, after suitable provision of a desired atmosphere inside the cavity, it is subjected to the same process as describe above, i.e. either melting such that it flows into the hole and seals it, or subjecting it to a pressing force with a tool, whereby the sealing SM is accomplished and the result in FIG. 21 is arrived at.

The advantage with this embodiment is that since the hole is made through the sealing material and the other layers present in one and the same etching step, the sealing material provided around the hole will of course be "perfectly aligned" with the hole. This can be difficult to achieve in other embodiments.

Also, there will be no metal on the walls in the hole.

The invention claimed is:

1. A method of making a semiconductor device having a closed cavity with a controlled atmosphere, comprising:
   providing a semiconductor substrate;
   providing a template on a localized area of the substrate, the template defining the interior shape of said cavity and the shape of a channel extending laterally to a point displaced from the cavity;
   depositing a material film over the entire substrate;
   making at least one hole through the material film down to the template for the channel;
   performing selective etching through said at least one hole to remove the template whereby said cavity and said channel is provided;
   providing sealing material around and adjacent to the hole in the substrate surface or in the hole without blocking the hole;
   allowing a desired atmosphere comprising a selected gas to enter into the cavity through said hole; and
   subjecting the sealing material to selected conditions such that the material is caused to enter the hole so as to seal the cavity, wherein
   the amount of sealing material provided is large enough that the hole after sealing is filled to a substantial degree.

2. The method according to claim 1, further comprising making a further hole through the material layer down to the template for the cavity, performing the selective etching through both holes whereby the cavity and the channel are provided.

3. The method according to claim 1, further comprising making a further hole through the material layer down to the template for the cavity, before the further hole is made and performing the selective etching through the further hole first, whereby the cavity is provided, and thereafter performing the etching through the first hole to create the channel; and comprising sealing the further hole before a controlled atmosphere is allowed to enter into the cavity.

4. The method of claim 1, wherein the sealing material is deformable.

5. The method of claim 4, wherein the deformable sealing material is a metal, selected from the group consisting of Au, Al, Ag, Cu, Ti, Cr, Ru, Pt.

6. The method of claim 5, wherein the deformable sealing material is selected from AuSn, CuSn, PbSn, AgSn, or AgCuSn.

7. The method of claim 5, comprising subjecting the sealing material to heat so as to melt the material whereby the sealing material flows into the hole.

8. The method of claim 7, wherein a layer of a flow enhancing material for the sealing material is deposited at least on the walls of the hole.

9. The method of claim 8, wherein the flow enhancing material is selected from the group consisting of polysilicon and polygermanium.

10. The method of claim 9, wherein the flow enhancing material is a metal, selected from Au, Al, Ag, Cu, Ti, Cr, Ru, or Pt.

11. The method of claim 1, comprising subjecting the sealing material to a pressing action using a tool, such that the material is caused to enter the hole to seal it, wherein the tool comprises a plate provided with a plurality of stamping members in a pattern corresponding to the pattern of holes to be sealed.

12. The method of claim 11, wherein the stamping members are slightly larger than the largest dimension of the deposited sealing material, and have a height larger than the height of the cavities on the substrate.

* * * * *